United States Patent [19]

Hasili

[11] Patent Number: 4,571,617

[45] Date of Patent: Feb. 18, 1986

[54] APPARATUS AND METHOD FOR MEASURING AND DISPLAYING THE PULSE WIDTH OF A VIDEO SIGNAL

[75] Inventor: Jacob P. Hasili, Hamilton Township, Mercer County, N.J.

[73] Assignee: RCA Corporation, Princeton, N.J.

[21] Appl. No.: 574,460

[22] Filed: Jan. 27, 1984

[51] Int. Cl.$^4$ ............................................. H04N 7/18
[52] U.S. Cl. .................................. 358/107; 356/376; 358/93
[58] Field of Search ................ 358/107, 106, 93, 139; 356/376, 380, 387, 383, 384; 250/222.1, 224

[56] References Cited

U.S. PATENT DOCUMENTS

| | | | |
|---|---|---|---|
| 3,579,249 | 5/1971 | Dewey et al. | 358/93 |
| 3,947,628 | 3/1976 | Alien et al. | 358/93 |
| 3,963,866 | 6/1976 | Tanie | 178/7.2 |
| 4,305,096 | 12/1981 | Yokoshima et al. | 358/101 |
| 4,363,050 | 12/1982 | Modla | 360/32 |
| 4,498,778 | 2/1985 | White | 358/107 X |

FOREIGN PATENT DOCUMENTS 33-6854 8/1958 Japan .

Primary Examiner—Howard W. Britton
Assistant Examiner—Victor R. Kostak
Attorney, Agent, or Firm—Birgit E. Morris; Donald S. Cohen; James M. Trygg

[57] ABSTRACT

An apparatus and method is shown for measuring the width of a data pulse of a video signal containing a synchronizing pulse associated with each data pulse. Every $N^{th}$ data pulse is measured and a digital representation of the measured value is displayed in standard units of length for viewing by a human observer.

7 Claims, 5 Drawing Figures

4,571,617

APPARATUS AND METHOD FOR MEASURING AND DISPLAYING THE PULSE WIDTH OF A VIDEO SIGNAL

This invention relates to apparatus for processing video signals and, more particularly, to such apparatus for measuring the width of a video data pulse and providing a digital display thereof.

BACKGROUND OF THE INVENTION

Apparatus for processing video signals and measuring the actual pulse width of these signals typically do not provide the results of the measurement in a form discernible to a human observer. For example, a method of detecting weld lines is disclosed in U.S. Pat. No. 4,305,096 issued Dec. 8, 1981 to Yokoshima et al. There, the video signal of the weld is compared with a reference threshold and binary coded into two signals, one representing a dark part and one representing a light part. These binary coded signals are then input to a computer for processing by a series of mathematical algorithms to determine various characteristics of the weld and to ultimately generate other signals for controlling the welding machine.

What would be advantageous and desirable is an apparatus and method for measuring the pulse width of such a video signal and displaying the results of the measurement in a form that is easily perceived by a human observer. Further the displayed indications should have a direct correspondence to a standard unit of measurement, or length, such as tenths of a micrometer.

SUMMARY OF THE INVENTION

According to the present invention apparatus is disclosed for providing indications at a rate which can be visually perceived by a human observer of the measured durations of select ones of data pulses interleaved in time with synchronizing pulses. The synchronizing pulses recur at a rate substantially higher than the rate of indication by a factor of n, n being a positive integer. The apparatus comprises:

(1) an oscillator supplying oscillations at a constant prescribed rate substantially higher than the data pulse durations to be measured;
(2) a counter for counting selected ones of the oscillations;
(3) a sync separator for separating the syncronizing pulses from the data pulses;
(4) cycle selection means for selecting every $N^{th}$ cycle of a respective syncronizing pulse followed by a respective data pulse, the duration of which is to be measured;
(5) a threshold detector for supplying indications of when the pulses, the durations of which are to be measured, exceed a threshold value;
(6) means responsive to the synchronizing pulse in each selected $N^{th}$ cycle for resetting the counter to zero count;
(7) means responsive to the indication from the threshold detector for enabling the counter during each selected $N^{th}$ cycle, to count the oscillations supplied to the counter from the oscillator; and
(8) display means responsive to the final count in the counter for each selected $N^{th}$ cycle to provide indication of the count to the human oberver until the next selected $N^{th}$ cycle.

DESCRIPTION OF THE PREFERRED EMBODIMENT

Figure 1:
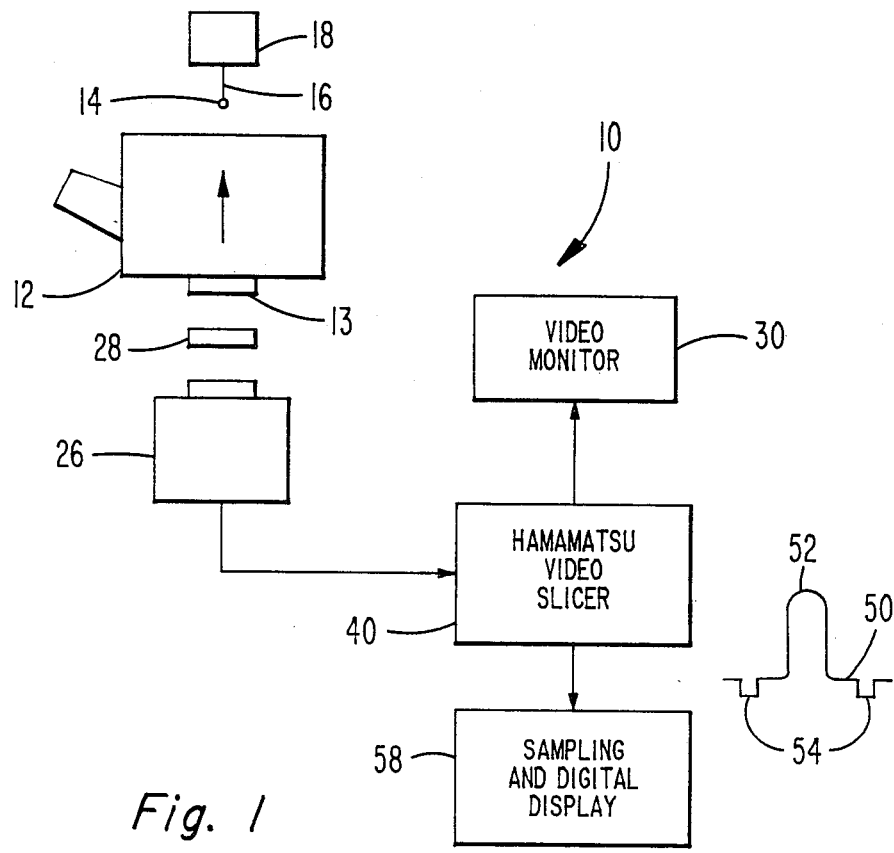
FIG. 1 is a block diagram of a stylus point viewing and measuring system having an apparatus for measuring and displaying the pulse width of a video signal utilizing the teachings of the present invention.
Figure 2:
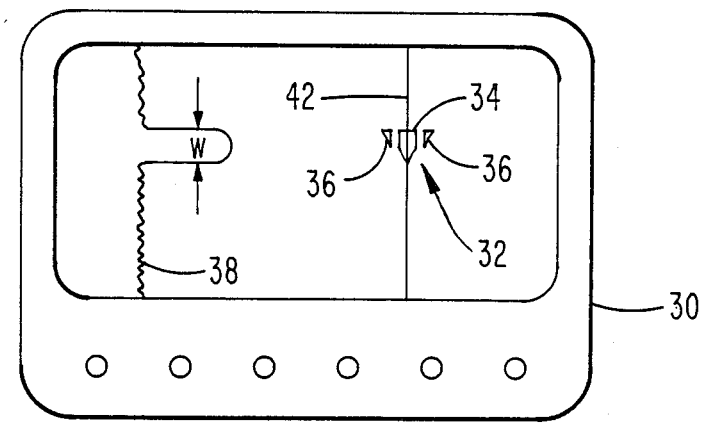
FIG. 2 is a representative view of the video monitor shown in FIG. 1.

With reference to FIGS. 1 and 2 there is shown a system block diagram depicting apparatus 10 for automatically measuring the length of the shoe of a video disc stylus. This apparatus is the subject of a copending application of John A. van Raalte filed concurrently with the present application, and entitled "Apparatus and Method for Automatically Measuring the Shoe-Length of a Video Disc Stylus" and having the No. 574 462.

The apparatus 10 includes a microscope 12 having a 1000X eyepiece 13 arranged to focus on the point 14 of a stylus 16 which is held in operating position within a stylus holder 18. A standard industrial TV camera 26, such as a one-inch RCA Nuvicon Camera (type N-1005), is positioned at a fixed distance from the eyepiece 13 so that the camera 26 may focus on the stylus point 14 through the optics of the microscope 12. The output of the camera 26 is displayed on a TV monitor 30. Magnification of the image received by the camera 26 may be increased to 3000X or even 5000X by simply inserting another lens 28 of the appropriate focal length at a point approximately two inches from the Nuvicon tube. In this way the size of the image displayed on the monitor 30, may be adjusted for comfortable viewing by an operator, independent of the actual size of the stylus point 14 that is being measured. As best seen in FIG. 2, an image 32 of the stylus point 14 is shown having a shoe 34 and two adjacent keel shoulders 36.

The video signal from the camera 26 which is displayed on the TV monitor 30, is first directed to a video slicer 40 which displays a vertical sampling line 42 on the monitor. By manipulating certain controls associated with the video slicer 40, the operator can move the sampling line 42 over the image 32 of the stylus point 14 until the line 42 is directly over the portion of the image whose length is to be measured. Since the images of the shoe 34 and keels 36 are the only bright objects in the field of view of the camera 26, when the sampling line 42 is positioned as shown in FIG. 2, the line 42 traverses dark regions above and below the bright image of the shoe 34. The video slicer 40 detects these differences in brightness and generates a video signal 50 corresponding thereto. An image 38, being a graphical representation of the signal, is displayed on the monitor 30 in a position horizontally in line with the image 32 as shown in FIG. 2. The amplitude of the image 38 represents the brightness along the sampling line 42 and the width W of the pulse as shown in FIG. 2, represents the length of the bright object, in this case the shoe 34. Similarly, the signal 50 includes a data pulse 52 having an amplitude representing the brightness of the object in the field of view of the camera 26 and a pulse width representing the length of the bright object. The signal 50 further includes synchronizing pulses 54 for identifying each video frame. This signal 50 is directed to a sampling and display circuit 58 which is the subject of the present invention.

Figure 3:
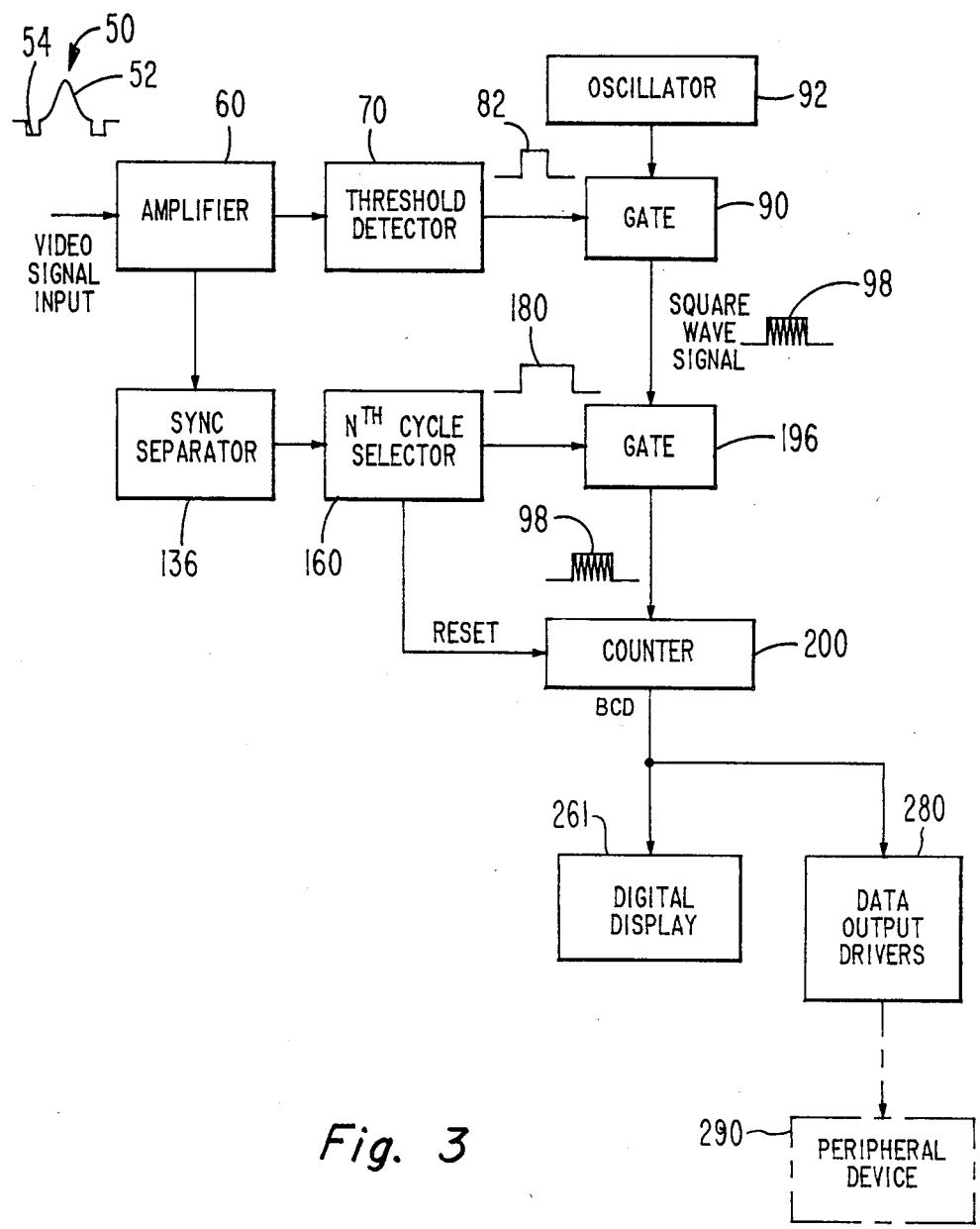
FIG. 3 is a block diagram showing the functional components of the apparatus of the present invention.

A block diagram of the sampling and display circuit 58 is shown in FIG. 3. Each block of the block diagram is also represented in one of FIGS. 4a and 4b as dashed lines and is identified with a like lead number. For example, the amplifier 60 shown in FIG. 3 represents the circuitry enclosed in the dashed lines 60 shown in FIG. 4a.

Figure 4A:
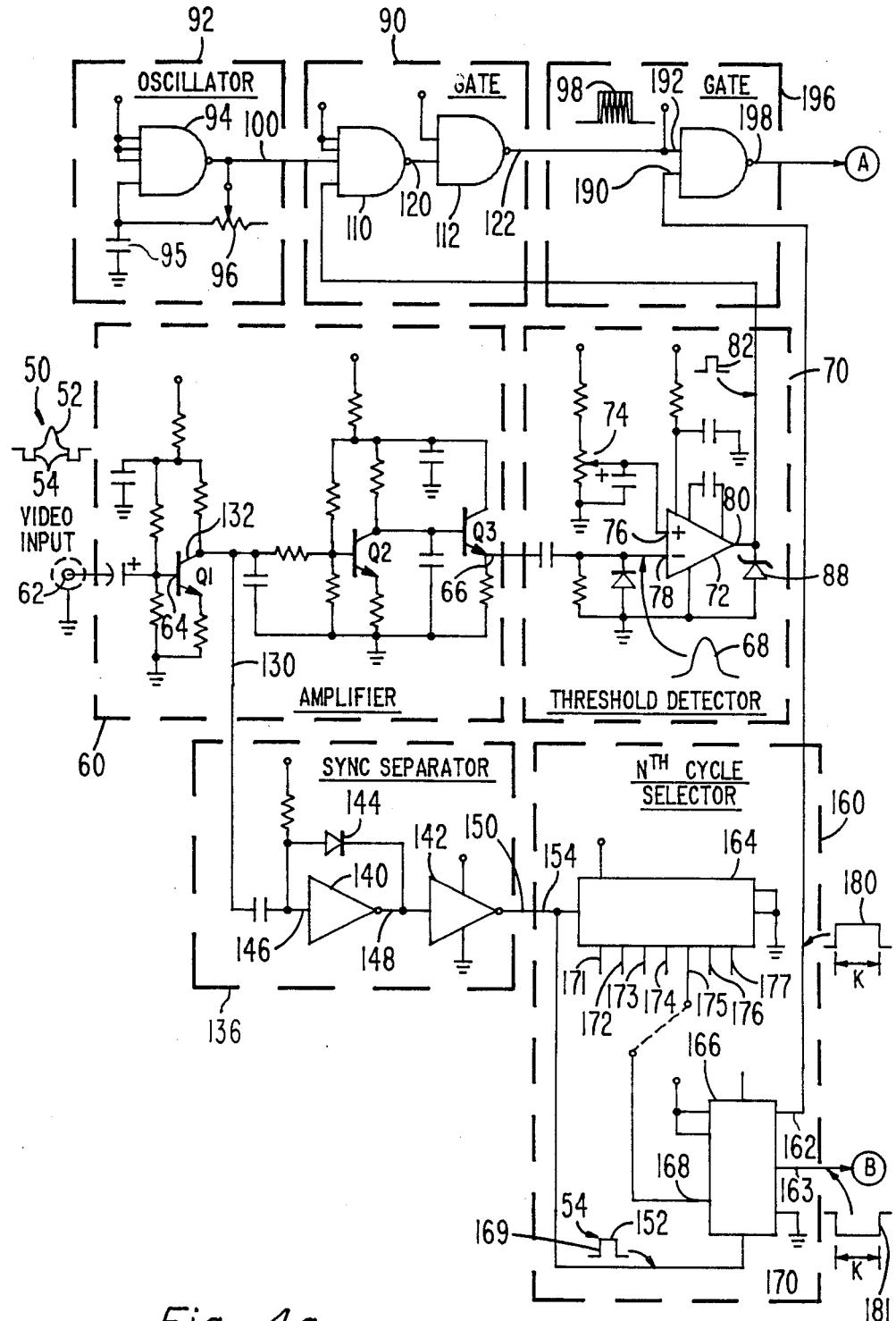
FIGS. 4a and 4b are schematic diagrams showing the preferred embodiment of the circuits of the functional components shown in FIG. 3.
Figure 4B:
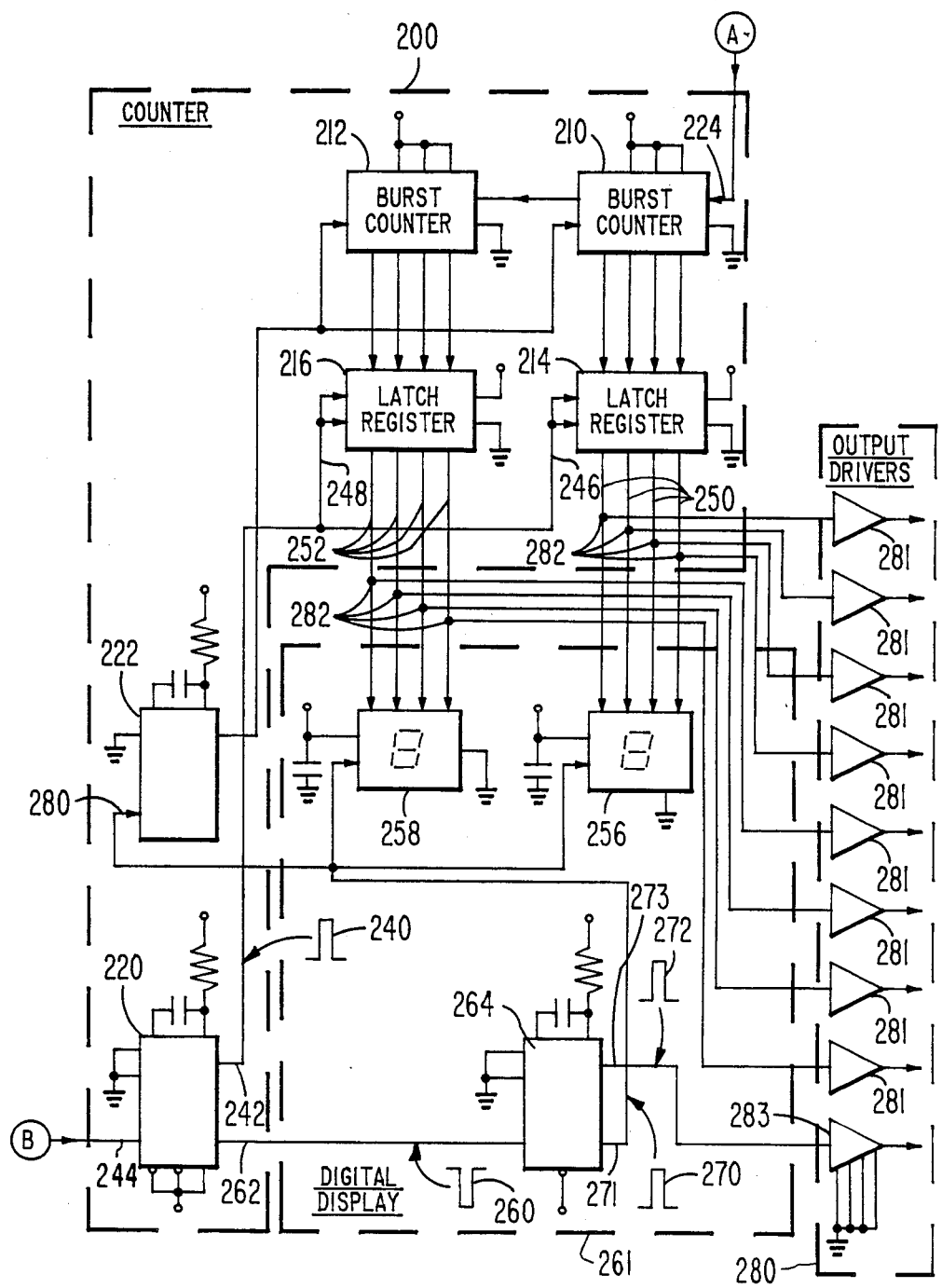

With reference to FIGS. 3, 4a, and 4b, the signal 50, which is a standard NTSC video signal, is input at 62 to the DC coupled amplifier 60 which comprises the three transistors Q1, Q2, and Q3, and related circuitry. This related circuitry is well known in the art and will not be described here. The signal 50 has an amplitude of approximately 0.5 V peak to peak as applied to the base 64 of the transistor Q1. The transistors Q1, Q2 and Q3 amplify the signal 50 to 6 volts peak to peak and output an amplified signal 68 at the emitter 66 of the transistor Q3. The transistor Q3 functions as an emitter follower in a manner well known in the art for providing increased power output. The amplified signal 68 is then directed to a threshold detector 70.

The threshold detector 70 comprises a comparator 72, a bias level adjustment 74 and related circuitry which is well known in the art and will not be described here. A preset bias voltage of approximately one volt, which may be adjusted by manipulating the bias level adjustment 74, is applied to the non-inverting positive input terminal 76 of the comparator 72. The amplified signal 68 is applied to the input terminal 78 of the comparator 72 and if it is equal to or exceeds the preset bias voltage, the output terminal 80 is caused to go high. This results in a square wave output signal 82 appearing on the output terminal 80. The signal 82 will have the same pulse width as the data pulse 52 of the video signal 50 at the one volt bias level. This type of comparator is well known in the art and will not be described further here. The zener diode 88 clamps the plus D.C. high voltage level appearing on the output 80 to an approximate maximum of five volts. This voltage level shift is performed to provide a signal compatible with the transistor to transistor logic (TTL) plus 5 VDC voltage level required by commercially available counting conversion logic to be described below. This signal then becomes the input to the gate 90.

An oscillator 92 comprising a NAND gate 94, a potentiometer 96, and a capacitor 95 form what is known in the art as a relaxation oscillator for generating oscillations 97 at the rate of 39.5 KHZ on the output 100. This signal, along with the signal 82 appearing on the output terminal 80 of the comparator 72 is impressed on the input of the gate 90. The gate 90 comprises a pair of NAND gates 110 and 112. As the signal 82 from the comparator 72 goes high the NAND gate 110 is enabled which allows the positive side of the oscillations 97 from the oscillator 92 to pass through to the output 120 of the NAND gate 110 in bursts. These bursts from the output signal 98 which in turn, is input to the NAND gate 112 for inversion and passed on to the output 122. Disposition of the signal 98 appearing on the output 122 will be described later.

With reference to the amplifier 60, an output 130 is provided having an amplification of the video signal 50 which appears on the collector 132 of the transistor Q1. This amplified signal 50 is input to a sync separator 136 for removing the data pulses 52, leaving only the synchronizing pulses 54. The sync separator 136 comprises an inverter 140, a buffer 142, and a negative feed back diode 144 arranged in parallel with the inverter 140, as shown in FIG. 4A. The diode 144 causes the inverter 140 to operate at the mid-range of its operating voltage level. Thus, when the sync pulses 54, which have a voltage level corresponding to the quiescent point of the inverter 140, appear on the input 146 of the inverter 140, the output 148 is reduced by about 5 volts which is sufficient to drive the buffer 142 to output full voltage at the output 150. Conversely, as data pulses 52, which have a voltage level below the quiesent point of the inverter 140, appear on the input 146, the output 148 undergoes a relatively small change of about two volts which is insufficient to drive the buffer 142. Therefore, the signal 152 appearing on the output 150 contains only the sync pulses 54 of the video signal 50.

The signal 152 is applied to an input 154 of an $N^{th}$ cycle selector 160 which generates, on the output 162, a signal 180 for every $N^{th}$ synchronizing pulse 54 that is detected on the input 154. The $N^{th}$ cycle selector 160 comprises an IC binary (shift register) counter 164 of a type that is commercially available, such as RCA part number CD4024, and a standard flip-flop 166. The counter 164, having a series of seven output terminals 171, 172, 173, 174, 175, 176, and 177, receives the signal 152 on the input 154 and counts the number of synchronizing pulses 54. For every four synchronizing pulses counted the output terminal 171 will alternately go high for two pulses and then low for two pulses. For every eight synchronizing pulses the terminal 172 will alternately go high for four pulses and then low for four pulses. Similarly, for the appropriate number of synchronizing pulses the output terminals 173–177 will go high for 8, 16, 32, 64, and 128 pulses respectively and then low for the same duration. One of these output terminals 171–177 is connected to the input 168 of the flip-flop 166. When a high is received on the input 168, the flip-flop 166 is set and will output a high on the output terminal 162 and will maintain this high independent of subsequent changes in state of the signal on the input terminal 168 until the flip-flop 166 is reset by receiving a signal on the input terminal 170 at which time the output terminal 162 will go low.

The signal 152, in addition to being applied to the counter, or shift register 164, is also applied to the flip-flop 166 at the input terminal 170. The flip-flop 166 is responsive to the leading edge 169 of the synchronizing pulse 54 and will reset upon detecting this edge. With this arrangement, the $N^{th}$ cycle selector will output a pulse at the terminal 162 for every 2nd, 4th, 8th, 16th, 32nd, 64th, or 128th synchronizing pulse detected on the input 154, depending on which output terminal 171–177 is utilized. In the present invention the output terminal 175 was selected for use for reasons given below. In this case, when 16 synchronizing pulses are counted by the counter, or shift register, 164 the terminal 175 will go high causing the input 168 to also go high thereby setting the flip-flop 166 which outputs a signal 180 on the output terminal 162. The very next synchronizing pulse 54 received on the input 170 resets the flip-flop 166 causing the output 162 to go low so that the signal 180 is generated as a square wave form having a pulse width K which is equal to the distance between adjacent synchronizing pulses 54 of the signal 50. The terminal 175 will stay high until until 14 more synchronizing pulses are received at which time it will go low for 16 additional synchronizing pulses, all of which have no effect on the state of the flip-flop 166. The next synchronizing pulse, that is the 33rd pulse, will again set the flip-flop 166 thereby beginning a new $N^{th}$ cycle. In this way the signal 180 contains a single pulse for every 32 synchronizing pulse 54 that are contained in the video input signal 50, each single pulse having a width K.

The signal 180 output by the $N^{th}$ cycle selector and the signal 98 output by the gate 90 are applied to the input terminals 190, 192 respectively of the NAND gate 196. In the case of the present invention, the gate 196 is enabled for one cycle upon detection of every 32nd cycle of the video input signal 50 and a single burst of the signal 98 is passed to the output 198 of the gate 196.

The signal 98 from the output 198 of the gate 196 is passed to the counter 200, see FIG. 4b, for counting the oscillations contained within a given burst. The counter 200 includes a pair of series connected four bit burst counters 210 and 212 each of which has its output connected to a latching register 214 and 216 respectively, and a pair of monostable multivibrators 220 and 222, as shown in FIG. 4b. The monostable multivibrators 220 and 222 are commercially available integrated circuits such as Texas Instrument part number 74LS123N. With the gate 196 enabled, the signal 98 is applied to the input 224 of the burst counter 210 which counts the oscillations generated by the oscillator 92. Overflow is passed in series to the burst counter 212. The counter 210 outputs a four bit BCD code representing the units position to the latch register 214 and the counter 212 outputs a four bit BCD code representing the tens position to the latch register 216.

The signal 181 appearing on the output terminal 163 of the flip-flop 166 is passed to the input terminal 244 of the multivibrator 220. This causes the multivibrator 220 to output a signal 240, having a relatively narrow pulse, to the input terminals 246 and 248 of the latch registers 214 and 216 respectively. The transfer of the four bit BCD codes from the counters 210 and 212 to the latch registers 214 and 216 is effected when the latch registers detect the signal 240. The BCD codes so transferred will appear on the output terminals 250 and 252 and remain there until the $N^{th}$ cycle selector 160 generates the next signal 180 and signal 181 representing the $N^{th}$ plus first cycle. The BCD codes appearing on the output terminals 250 and 252 are passed to a digital display 261 and are connected to a pair of digital readout units 256 and 258 for displaying the numeric values of the BCD codes when the units are enabled. These digital readout units may be any suitable commercially available display devices such as that supplied by Hewlett Packard as part number 5082-7340.

The multivibrator 220 also generates a signal 260 on the output terminal 262 which is input to a third multivibrator 264. This signal 260 indicates that the oscillations of the signal 98 has been totaled by the burst counters 210 and 212 and has been successfully transferred to the latch registers 214 and 216. This causes the multivibrator 264 to generate two output signals 270 and 272. The first of these signals, signed 270, which appears on the output terminal 271, is passed to the digital readout units 256 and 258 which are enabled upon detection of the signal. The signal 270 is also impressed onto the input terminal 280 of the multivibrator 222. Upon detection of this signal the multivibrator 222 will reset the burst counters 210 and 212 which are now ready to receive a new burst of oscillations from the gate 196 representing the next $N^{th}$ cycle. The second of these signals, signal 272, which appears on the output terminal 273, is passed to an output driver 280 and is connected directly to a strobe driver 283 which indicates that data is present on the output drivers 281 and may be interrogated by some other peripheral device 290 such as a computer or the like. The data appearing at the output drivers 281 is parallel coupled at 282 to the output terminals 250 and 252 of the latch registers 214 and 216 in a manner that is well known in the art.

The number of standard oscillations of the signal 98 that will appear on the output 120 of the gate 90 is determined by the length of time that the NAND gate 110 is enabled by the signal 82 from the threshold detector 70. Each pulse of the signal 82 has a pulse width that exactly corresponds to the width of the data pulse 52 of the video input signal 50 at a reference amplitude of one volt. Therefore, the signal appearing on the output terminal 120 of the NAND gate 110 will include a burst of oscillations, the number of which also will exactly correspond to the width of the data pulse 52 at one volt.

The digital output of the two display modules 256 and 258 can be made to directly correspond to tenths of a micrometer by tuning the base frequency of the oscillator 92 by a method that is well known in the art. In this way a direct read out in tenths of a micrometer of the length of the image 32 along the sampling line 42 is displayed for viewing by the operator. Furthermore, the sampling rate of one display refresh every 32 cycles, permits relative stability in the display with little flicker thereby permitting visual perception by a human observer.

I claim:

1. Apparatus for providing indications at a rate which can be visually perceived by a human observer of the measured durations of selected ones of data pulses interleaved in time with synchronizing pulses, which synchronizing pulses recur at a rate substantially higher than said rate of indication by a factor of n, n being a positive integer, said apparatus comprising:
   a. an oscillator supplying oscillations at a constant prescribed rate substantially higher than the data pulse durations to be measured;
   b. a counter for counting selected ones of said oscillations;
   c. a sync separator for separating said synchronizing pulses from said data pulses;
   d. $N^{th}$ means for selecting every $N^{th}$ cycle of a respective synchronizing pulse followed by a respective data pulse, the duration of which is to be measured;
   e. a threshold detector for supplying indications of when the pulses, the durations of which are to be measured, exceed a threshold value;
   f. means responsive to the synchronizing pulse in each selected $N^{th}$ cycle for resetting said counter to zero count;
   g. means responsive to said indication from said threshold detector for enabling said counter during each selected $N^{th}$ cycle, to count said oscillations supplied to said counter from said oscillator; and
   h. display means responsive to the final count in said counter for each selected $N^{th}$ cycle to provide indications of said count to said human observer until the next selected $N^{th}$ cycle.

2. The apparatus as set forth in claim 1 wherein said prescribed rate of oscillations supplied by said oscillator, said counter for counting said oscillations, and said display means responsive to the final count of said counter are arranged so that said indications are in standard units of length.

3. The apparatus set forth in claim 2 wherein said standard units of length are tenths of a micrometer.

4. The apparatus set forth in claim 3 wherein said $N^{th}$ cycle selector means comprises a binary shift register and a flip-flop wherein said binary shift register responsive to every said $N^{th}$ cycle of a respective synchronizing pulse outputs a signal on a first input to said flip-flop for enabling said flip-flop and wherein said flip-flop is disabled when a next synchronizing pulse is detected on a second input to said flip-flop.

5. A method of measuring the width of a data pulse of a video signal having a synchronizing pulse associated with each data pulse comprising:

(a) amplifying said video signal;

(b) detecting if said data pulse to be measured exceeds a threshold value and generating a square wave signal corresponding thereto;

(c) supplying a signal having oscillations at a constant prescribed rate substantially higher than the data pulse durations to be measured;

(d) gating said signal having oscillations with said square wave signal and generating a signal having bursts of oscillations, the number of which corresponds to the width of the data pulse to be measured;

(e) selecting every $N^{th}$ burst of oscillations from said signal having bursts of oscillations;

(d) counting said oscillations of the selected said $N^{th}$ burst of oscillations and displaying the final count of said counting for viewing by a human observer.

6. The method set forth in claim 5 wherein step (e) includes: (1) counting said synchronizing pulses and upon counting every $N^{th}$ one enabling said counting of said oscillations and (2) disabling said counting of said oscillations upon detecting every $N^{th}+1$ of said synchronizing pulses.

7. The method set forth in claim 6 wherein step (c) includes supplying a signal having oscillations at a rate so that said displaying of said final count in step (d) is indicated in standard units of length.

* * * * *

UNITED STATES PATENT AND TRADEMARK OFFICE
CERTIFICATE OF CORRECTION

PATENT NO. : 4,571,617
DATED : February 18, 1986
INVENTOR(S) : Jacob P. Hasili

It is certified that error appears in the above-identified patent and that said Letters Patent is hereby corrected as shown below:

Column 6, line 50, insert --selector-- after the first occurrence of "Nth".

Signed and Sealed this

Third Day of June 1986

[SEAL]

Attest:

DONALD J. QUIGG

Attesting Officer

Commissioner of Patents and Trademarks